United States Patent
Brist et al.

(10) Patent No.: US 7,361,842 B2
(45) Date of Patent: Apr. 22, 2008

(54) APPARATUS AND METHOD FOR AN EMBEDDED AIR DIELECTRIC FOR A PACKAGE AND A PRINTED CIRCUIT BOARD

(75) Inventors: Gary A. Brist, Yamhill, OR (US); William O. Alger, Portland, OR (US); Gary B. Long, Aloha, OR (US); Jayne L. Mershon, Corbett, OR (US); Michael W. Beckman, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 177 days.

(21) Appl. No.: 11/171,750

(22) Filed: Jun. 30, 2005

(65) Prior Publication Data

US 2007/0000687 A1    Jan. 4, 2007

(51) Int. Cl.
H05K 1/03      (2006.01)
H05K 3/36      (2006.01)
H05K 3/30      (2006.01)

(52) U.S. Cl. .......... 174/255; 174/252; 29/830; 29/832

(58) Field of Classification Search .......... 174/250, 174/252, 254, 255, 261; 29/830, 832
See application file for complete search history.

(56) References Cited

U.S. PATENT DOCUMENTS 5,955,828 A * 9/1999 Sadwick et al. ............ 313/310
2002/0088646 A1 * 7/2002 Caplet et al. ............... 174/261

* cited by examiner

Primary Examiner—Jeremy C Norris
(74) Attorney, Agent, or Firm—Buckley, Maschoff & Talwalkar LLC

(57) ABSTRACT

A method, apparatus, and system for a printed circuit board (PCB) and package with an embedded air dielectric includes a conductor formed on a surface of a first core layer, a conductor layer overlaying an inner surface of a cavity formed in a second core layer, the conductor layer opposing the conductor, and a sealed air channel between and separating the conductor and the conductor layer from contacting each other. A gas in the sealed air channel provides a primary dielectric therein. The gas may be air.

15 Claims, 5 Drawing Sheets

APPARATUS AND METHOD FOR AN EMBEDDED AIR DIELECTRIC FOR A PACKAGE AND A PRINTED CIRCUIT BOARD

BACKGROUND OF THE INVENTION

The ability of a dielectric material to support an electrostatic field while dissipating minimal energy in the form of heat (i.e., the proportion of energy lost as heat) may be referred to as the dielectric loss of the material. The lower the dielectric loss, the more effective is the dielectric material. The extent to which a substance or material concentrates electrostatic lines of flux of an electrical field may be referred to as the dielectric constant of a material. Substances and materials with a low dielectric constant and low dielectric loss include air, perfect vacuum, dry air, and a number of pure, dry gases.

The dielectric constant also relates to the speed at which an electromagnetic field can propagate through a material.

Thus, there is a general need for an electronic package structure and a printed circuit board that uses a low dielectric constant and low dielectric loss material in a small package that can be provided by an efficient method.

DETAILED DESCRIPTION

The several embodiments described herein are solely for the purpose of illustration. Embodiments may include any currently or hereafter-known versions of the elements described herein. Therefore, persons skilled in the art will recognize from this description that other embodiments may be practiced with various modifications and alterations.

Figure 1:
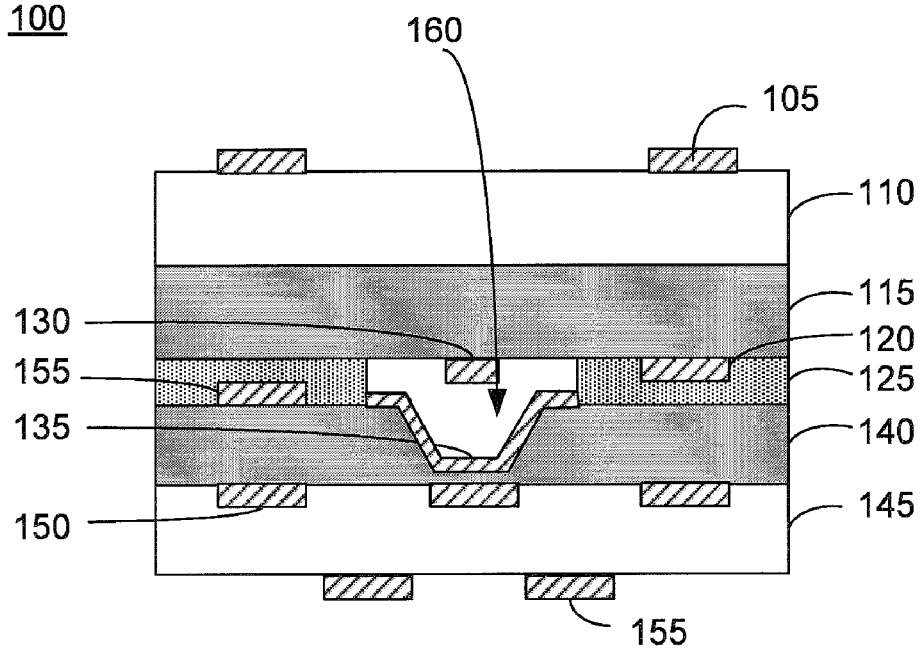
FIG. 1 is an exemplary schematic cross-section of an apparatus, in accordance with some embodiments herein.

FIG. 1 is a cross-sectional view of an exemplary apparatus in accordance with some embodiments herein, generally represented by reference numeral 100. Apparatus 100 may comprise an IC package and/or a printed circuit board (PCB). Those skilled in the art will have an appreciation and understanding of the component materials and methods of fabrication of IC devices, PCB, and IC packaging using, for example, thermoset materials. Accordingly, while the present disclosure may reference some IC package fabrication component materials and methods, a detailed discussion of same is not included herein.

Apparatus 100 includes a prepreg layer 110 having a conductive trace or conductor 105 thereon, a first core layer 115, a low-flow adhesive 125, a second core layer 140, and another prepreg layer 145 that has a conductive trace or conductor 155 thereon. Prepreg layers 110,145 may comprise an uncured or a B-stage fiberglass-epoxy resin. First core layer 115 may have a number of conductive traces 120 placed on or connected thereto. In some embodiments, second core layer 140 may have a number of conductive traces 150 placed on or connected to a planar surface thereof and a number of conductive traces 155 placed on or connected to an opposing planar surface of the second core layer. The first and second core layers 115, 140 may comprise a thin piece of dielectric material with a copper foil bonded to both sides thereof. The core dielectric material may be, for example, a cured fiberglass-epoxy resin. In some embodiments, core layers 115, 140 may include multilayers (not shown), as understood by those skilled in the art.

In some embodiments, first core layer 115 has a conductor 130 placed on or connected thereto. Conductor 130, including a conductive trace, may be fabricated on or connected to first core layer 115 using a variety of methods and techniques, including those now known and those that become known in the future. Second core layer 140 may have a cavity therein, located substantially opposite conductor 130. The cavity may have a conductor overlay 135 on an inner surface of the cavity. Conductive overlay 135 may cover a bottom surface and/or sidewall surfaces of the cavity formed in second core layer 140.

In some embodiments, the sidewalls of the cavity are angled such that the cavity formed in the second core layer is substantially concave in shape with the sidewalls and bottom surface of the cavity defining a void in second core layer 140 that is overlaid with conductor layer 135. Examples may include, but are not limited to, cavities formed by chemical etch, mechanical saw/cutters, imprinting or lasing.

Low-flow adhesive 125 may include a no-flow adhesive. Low-flow adhesive 125 may be shaped and controlled such that its placement and flow may be precisely controlled and limited to specific areas of apparatus 100. As shown, low-flow adhesive 125 is placed between portions of first core layer 115 and second core layer 140. In some embodiments, low-flow adhesive 125 is not placed in a region between conductor 130 and conductor layer 135, including a region directly between first core layer 115 and second core layer 140. In some embodiments, core layer 140 may be a multilayer structure.

Low-flow adhesive 125 cooperates with core layers 115, 140 to provide a sealed air channel 160. Sealed air channel 160 retains a quantity of gas therein in a region between conductor 130 and conductor layer 135. The gas retained in sealed air channel 160 may include, for example, air and/or other gasses. In some embodiments, the gas in air channel 160 may be maintained under a vacuum.

In some embodiments, the sealed air channel may operate to provide an air dielectric in the region between conductor 130 and conductor layer 135. According, a primary dielectric in the region between conductor 130 and conductor layer 135 is air having a relatively low dielectric constant and low dielectric loss. In some embodiments, the dielectric constant of the sealed air channel is about 1.0 to about 1.5, depending on the pressure and purity of the gas in the sealed air channel.

In some embodiments, the electrical interconnect including conductor 130, conductor layer 135, and sealed air channel 160 is embedded in a PCB or other electronic packaging. In some embodiments, electrical components may be electrically connected to apparatus 100 to include the electrical interconnect including conductor 130, conductor layer 135, and sealed air channel 160 in an electrical circuit or system.

In some embodiments, conductor 130 and conductor layer 135 may have differing electrical potentials there between. For example, conductor 160 may carry a positive or negative voltage and conductor layer 135 may be at a ground potential. In some embodiments, sealed air channel may form part of a capacitor including conductor 130 and conductor layer 135. In some embodiments, sealed air channel may form part of a parallel plate structure between a planar surface including conductor 130 and an opposing planar surface including conductor layer 135.

Figure 2:
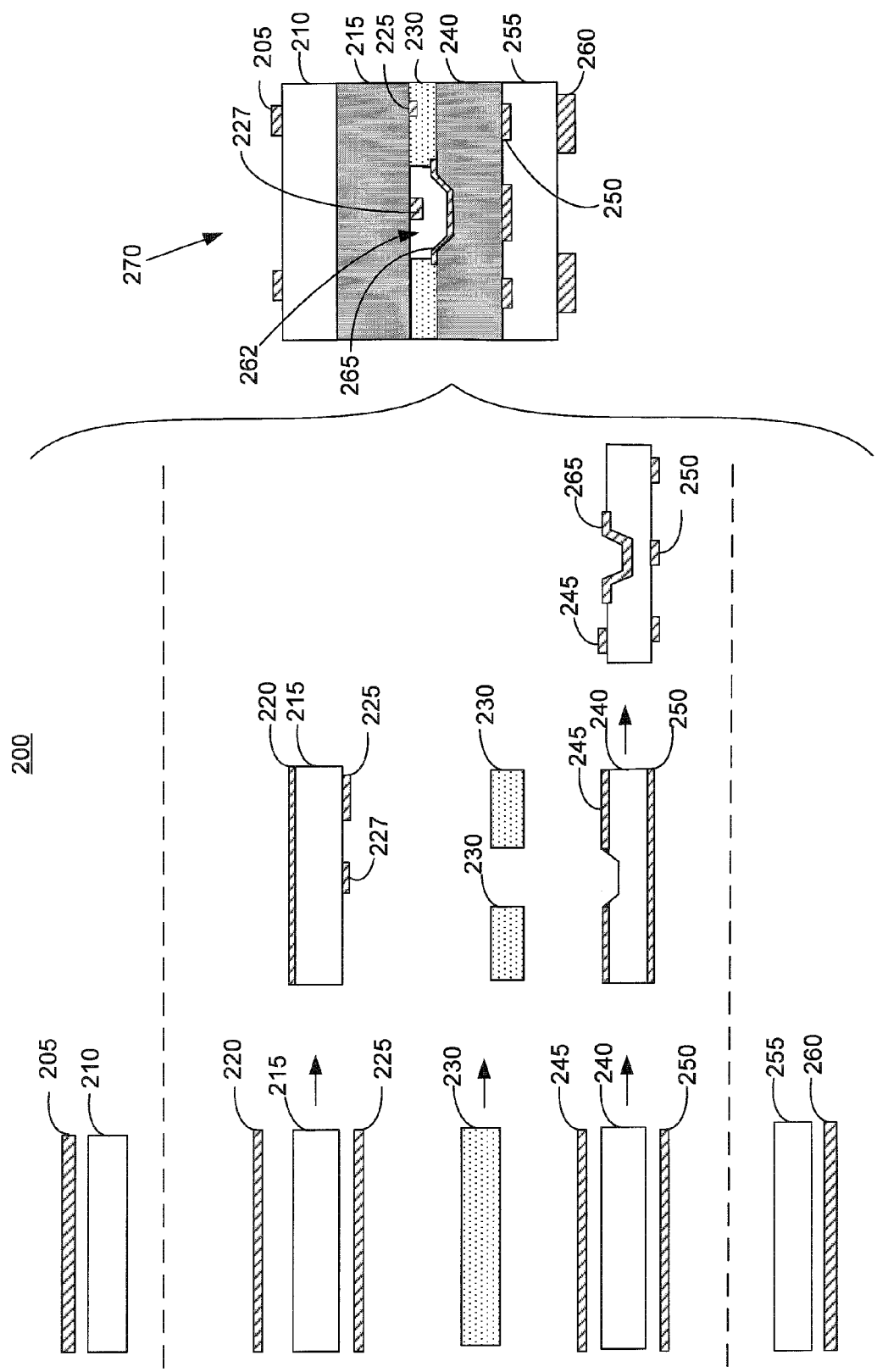
FIG. 2 is an exemplary depiction of the apparatus of FIG. 1 at various stages of fabrication thereof, in accordance with some embodiments herein.

FIG. 2 illustrates a number of exemplary, simplified stages of fabrication, 200, for an apparatus 270. The stages of fabrication shown in FIG. 2 are not intended to be exhaustive but instead illustrative of a number of processes that may be used in the fabrication of an apparatus, in accordance with some embodiments herein. Referring to a left side of FIG. 2, a layer of prepreg material 210 has a conductor layer 205 (e.g., copper) adhered thereto.

The adhesion of conductor layer 205 to prepreg material 210 may occurs at the same time 230 is laminated to 215 and 240. The first core 215 and second core 240 may usually be processed separately in parallel or sequentially to form the conductive features 220, 227, 225, 245, 265, 250, etc. The adhesive 230 may be processed separately in parallel or sequentially with the first and second cores. Once the first and second cores are processed and 230 formed correctly all pieces are laminated/bonded together to form 270. At this stage in the process, 270 will still be capped with 205 and 260. Device 270 may then be processed by plating/etching, for example, to form individual conductive patterns in conductor layers 205 and 260.

In some embodiments, conductor layer 205 may be bonded to prepreg 210 prior to the lamination step if prepreg 210 is a thermoplastic material. Thermoplastic materials can be softened/melted and hardened multiple times. The same applies to 260 and 255. Thermoset materials once hardened (i.e., polymer chains in B-stage epoxy crosslinked) cannot be re-melted or reflowed.

The prepreg may include a low viscosity B-stage epoxy that may flow in a further lamination process. A first core layer 215 may be clad on both sides thereof by conductor layers 220, 225 (e.g., copper). A second core layer 240 may be clad on both sides thereof by conductor layers 245, 250. The conductor layers on second core layer 240 may be similar to or differ from the conductive layers disposed on first core layer 215. A low-flow or no-low adhesive 230 is provided for placement between, at least, portions of first core layer 215 and second core layer 240. Another layer of prepreg material 255 having a conductor layer 260 adhered thereto is provided for the fabrication of device 270.

Further processing of the first and second core layers is accomplished to prepare the core layers for finalization of device 270. The further fabrication processing may include known IC device and PCB fabrication techniques and methods. For example, conductor layer 225 may be imaged, etched, or otherwise processed to obtain a desired conductive pattern thereon. It should be appreciated that at least one area of conductor layer 225 will remain on first core layer 215 to position over a conductive cavity in device 270.

Second core layer 240 may be routed, punched, etched, lased, trenched or otherwise processed to form a cavity therein, as shown. The cavity formed in core layer 240 is provided with a conductive layer overlay 265. Conductive layer overlay 265 may be plated onto an inner surface of the cavity in second core layer 240. Conductor layer 265 may be applied to an inner surface of the cavity using a number and variety of other methods such as, for example, etching and plating (electrolytic and electro-less).

Low-flow adhesive 230 may be mechanically or chemically routed, punched, etched, lased, trenched or otherwise processed to form a hole therethrough. The throughhole, channel, or clearance in low-flow adhesive 230 is provided to facilitate defining the sealed air channel in device 270. Herein, throughhole may refer to a round hole formed with a mechanical drill, as understood by those skilled in the art.

Referring to a right-most section of FIG. 2, there is shown the fabricated device 270 including a sealed air channel 262 having an air dielectric embedded therein. The various component layers of device 270 may be finalized using, for example, lamination processes and techniques suitable for fabricating a multilayered PCB or electronic package. For example, the multiple layers may be laminated under high pressures (e.g., about 200 psi-400 psi) and high temperatures (e.g., about 240° C.-320° C.).

Figure 3:
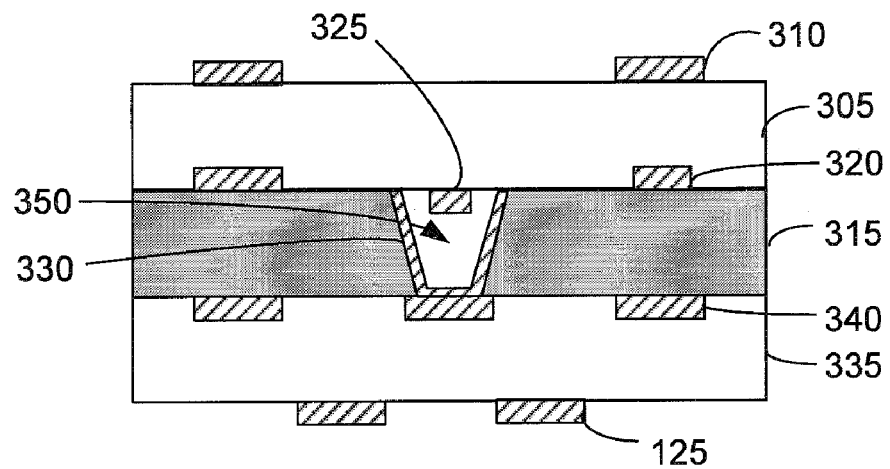
FIG. 3 is an exemplary schematic cross-section of an apparatus in accordance with some embodiments herein.

FIG. 3 is a cross-sectional view of an exemplary apparatus in accordance with some embodiments herein, generally represented by reference numeral 300. Apparatus 300 may comprise an IC package and/or a PCB, including thermoplastic materials. Those skilled in the art will appreciate and understand the properties and characteristics of the component materials and methods of fabrication of IC devices and IC packaging using thermoplastic materials. Accordingly, a detailed discussion of such is not included herein.

Apparatus 300 includes a first thermoplastic core layer 305 having a conductive trace or conductor 310 thereon, a core layer 315, a second thermoplastic core layer 335 that has a conductive trace or conductor 345 thereon. First thermoplastic core layer 305 may have a number of conductive traces 310 placed on or connected thereto. In some embodiments, core layer 315 may have a number of conductive traces 320, 340 placed on or connected to opposing planar surfaces thereof.

First and second thermoplastic core layers 305, 335 may comprise a copper clad thermoplastic core of dielectric material with a copper foil bonded to both sides thereof. The core dielectric material may be a cured fiberglass-epoxy resin. In some embodiments, thermoplastic core layers 305, 335 may include multilayers (not shown).

In some embodiments, core layer 315 may have a cavity therein or therethough. The cavity is devoid of the material (e.g., a dielectric) comprising the core layer and is closed on one end by a conductor layer and open on the other end of the cavity. The cavity may have a conductor overlay 330 on an inner surface thereof. Conductive overlay 330 may cover a bottom surface as well as sidewall surfaces of the cavity in core layer 315. In some embodiments, core layer 315 may be a multilayer structure.

In some embodiments, the sidewalls of the cavity are angled such that the cavity formed in core layer 315 is substantially concave in shape with the sidewalls and bottom surface of the cavity defining a void that is overlaid with conductor layer 330.

In some embodiments, a bottom planar surface of first thermoplastic core layer 305 cooperates with conductor layer 330 to provide a sealed air channel 350 that includes conductor 325 in the sealed portion thereof. Sealed air channel 350 retains a quantity of gas therein in a region between conductor 325 and conductor layer 330. The gas retained in sealed air channel 350 may include, for example, air and/or other gasses. In some embodiments, the gas in air channel 350 may be maintained under a vacuum.

In some embodiments, the sealed air channel may operate to provide an air dielectric in the region between conductor 325 and conductor layer 330.

In some embodiments, the electrical interconnect including conductor 325, conductor layer 330, and sealed air channel 350 is embedded in a PCB or other electronic packaging. In some embodiments, electrical components may be electrically connected to apparatus 300 in an electrical circuit or system.

In some embodiments, conductor 325 and conductor layer 330 may, operationally, have different electrical potentials therebetween. For example, conductor 325 may have a positive or negative voltage potential and conductor layer 165 may be at a ground potential.

Figure 4:
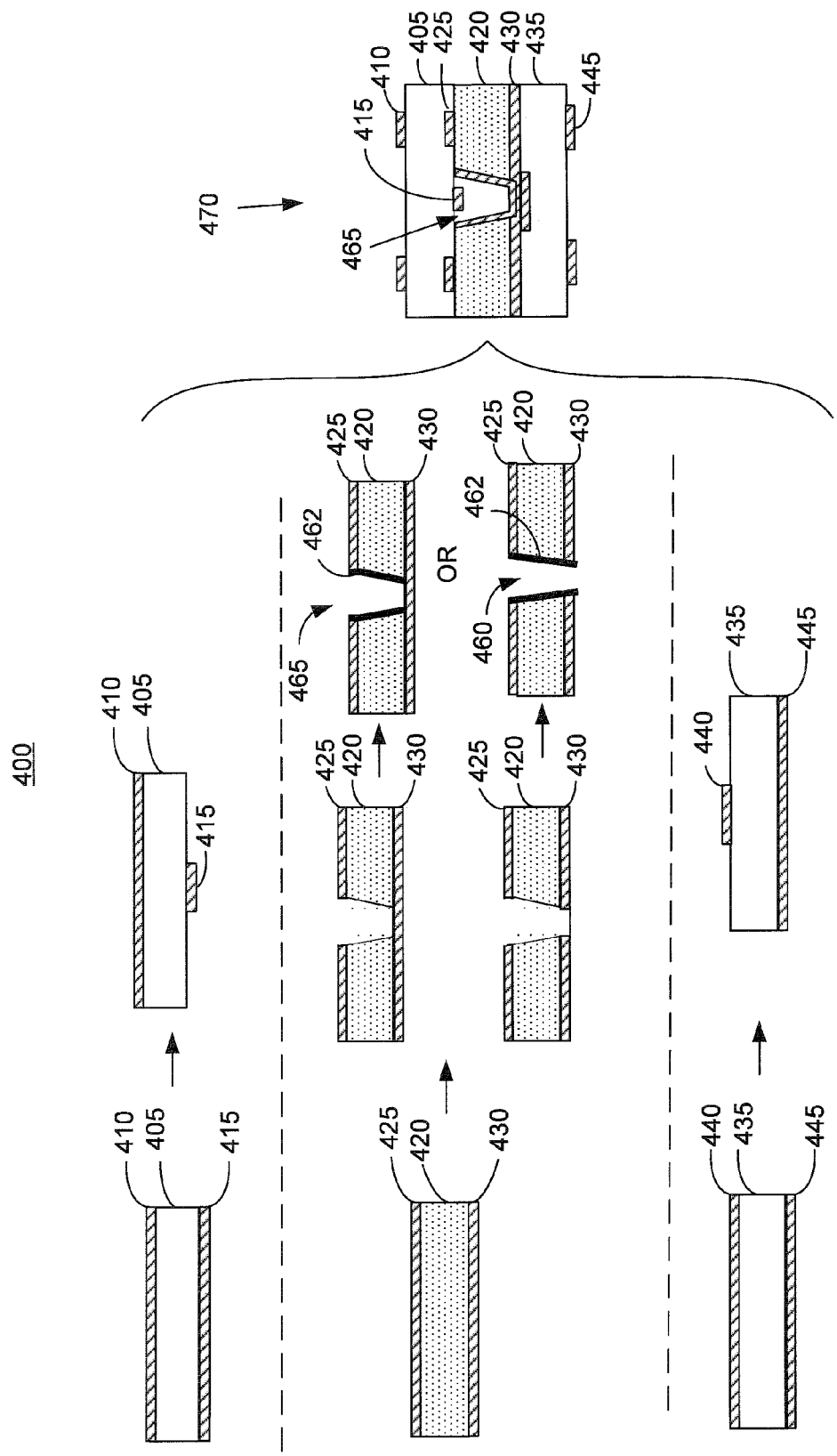
FIG. 4 is an exemplary depiction of the apparatus of FIG. 2 at various stages of fabrication thereof, in accordance with some embodiments herein.

FIG. 4 illustrates a number of exemplary, simplified fabrication stages 400 that may be used, at least in part, to fabricate an apparatus 470. The stages of fabrication shown in FIG. 4 are not intended to be exhaustive but instead illustrative of a number of processes that may be used in the fabrication of an apparatus, in accordance with some embodiments herein. Referring to a left side of FIG. 4, a copper clad thermoplastic (dielectric) core 405 is provided. First thermoplastic core 405 is clad on opposing sides thereof with conductive layers 410 and 415. Copper clad thermoplastic (dielectric) core 435 is provided as a second thermoplastic layer. Second thermoplastic core layer 435 is clad on opposing sides thereof with conductive layers 440 and 445.

Further processing of the first and second thermoplastic core layers 405, 435 is accomplished to prepare the thermoplastic core layers for finalization of device 470. The further fabrication may include known IC device and PCB fabrication processing techniques and methods such as, for example, imaging, etching and processing to obtain a desired conductive pattern on thermoplastic core layers 405, 435.

It should be appreciated that at least one area of conductor layer 415 will remain on first thermoplastic core layer 415 to position over a conductive layer on a cavity in device 470.

Second thermoplastic core layer 420 may be routed, punched, etched, lased, trenched or otherwise processed to form a cavity therein. In some embodiments, bottom conductor layer 430 clad to second thermoplastic core layer may be used as an ablation or etch stop for the removal of the core material in the vicinity of a cavity 465. In some embodiments, bottom conductor layer 430 clad to second thermoplastic core layer 420 may also be removed such that there is a hole 460 through core 420, to form a cavity 460.

Regarding the fabrication of cavity 465 and cavity 460, a conductor layer 462 is applied in the cavity. The conductive layer overlay 462 may be plated or otherwise bonded onto an inner surface of cavity 465, 460. Conductor layer 465 may be applied to an inner surface of the cavity using a number and variety of methods suitable for adhering a conductor to a dielectric core. Referring to cavities 465 and 460, the conductor overlay is applied, at least, to sidewalls of the cavity.

Although core layer 420 is shown processed to form a cavity therein in two different manners, (i.e., cavity having conductor bottom and cavity not having a bottom), a core layer of either one of the two differently illustrated cavities may be used in the fabrication of device 470.

Referring to a right-most section of FIG. 4, there is shown the fabricated device 470 including the sealed air channel having an air dielectric sealed by thermoplastic core layers. The various component layers of the device may be finalized using lamination processes and techniques suitable for fabricating a multilayered PCB or electronic package.

Figure 5:
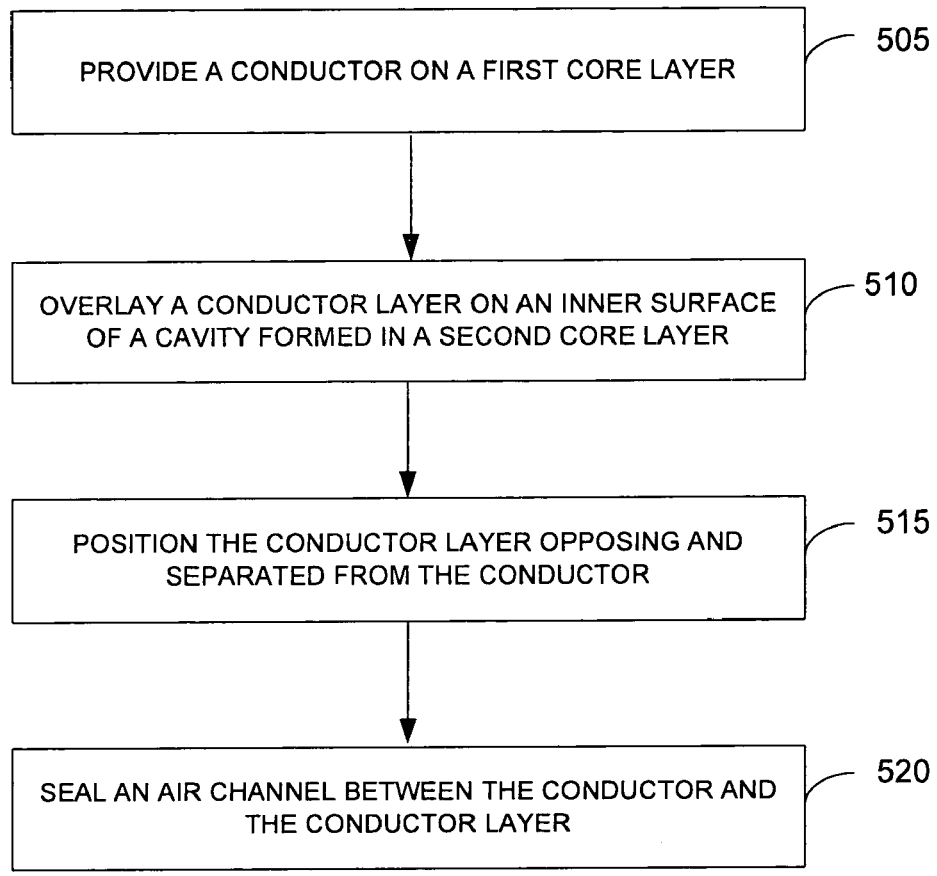
FIG. 5 is an exemplary flow diagram for a method, in accordance with some embodiments herein.

FIG. 5 is an exemplary flowchart illustrative of a method 500 for fabricating a device in accordance with some embodiments herein. At an operation 505, a conductor is provided on a first core layer. In some embodiments, the first core layer may be a thermoset material or a thermoplastic material. Based on the materials and desired application, the processing of the first core layer and the conductor thereon may be processed in a variety of techniques and methods.

At operation 510, a conductor layer is overlaid on an inner surface of a cavity formed in a second core layer. In some embodiments, the second core layer may be a thermoset material or a thermoplastic material. The conductor layer overlaying the cavity is on, at least, sidewall surfaces of the cavity. In some embodiments, the cavity is concave into the second core layer.

At an operation 515, the conductor layer that overlays the cavity is positioned such that it opposes the conductor on the first core layer and is separated from the conductor on the first core layer. In some embodiments, a portion of the conductor may extend into the cavity but not touching the cavity.

At operation 520, a sealed air channel is formed between the conductor and the conductor layer overlaying the cavity. The sealed air channel retains a quantity of gas therein. The gas is in fluid communication with the conductor and the conductor layer overlaying the cavity, in a space therebetween and defined, in part, by the first core layer and the second core layer. In some embodiments, a low-flow adhesive may be position between at least portions of the first and second core layers to assist in providing a seal for the sealed air channel. The low-flow adhesive may be used, for example, in an instance one or both of the core layers comprise thermoset materials.

Figure 6:
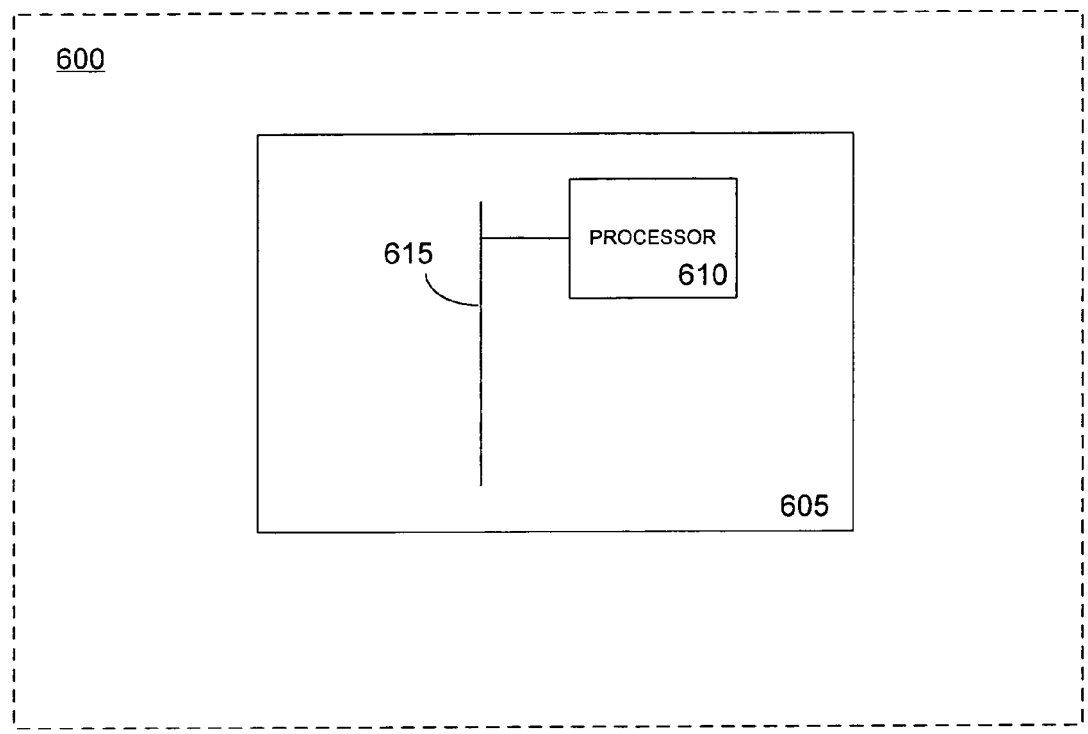
FIG. 6 is a system, in accordance with some embodiments herein.

FIG. 6 is a system 600, in accordance with some embodiments herein. In particular, system 600 includes a PCB 605 in accordance with some embodiments herein. FIG. 6 is provided to illustrate a concise, not exhaustive, general representation of a system, in accordance with some embodiments herein. PCB 605 may be fabricated in accordance with some of the methods disclosed herein. The method(s) of fabricating apparatus 600 may be based, in part, on the materials comprising the apparatus. System 600 includes a processor 610 electrically connected to a conductor 615 of PCB 605. In some embodiments, conductor 615 may include a conductor layer, an electrical trace, a communication bus, a communication link, and other electrical connective devices, methods, and techniques. Processor 610 may include, for example, a dual core processor. In some embodiments, IC 610 may be mounted and supported by PCB 605.

It should be appreciated that system 600 may comprise additional, fewer, and alternative components to those depicted in FIG. 6. For example, system 600 may comprise part of a desktop computing system. In such instance, additional components to implement the desktop computing system may be connected to PCB 605.

The foregoing disclosure has been described with reference to specific exemplary embodiments thereof. It will, however, be evident that various modifications and changes may be made thereto without departing from the broader spirit and scope set forth in the appended claims.

What is claimed is:

1. A printed circuit board (PCB) comprising;
a conductor formed on a surface of a first core layer:

a conductor layer overlaying an inner surface of a cavity formed in a second core layer, the inner surface of the cavity including a bottom surface and sidewalls overlaid by the conductor layer, wherein the conductor layer opposes the conductor;

a sealed air channel between and separating the conductor and the conductor layer from contacting each other; and a low flow adhesive between the first core layer and the conductor layer to, at least, provide a seal for the sealed air channel.

2. The PCB of claim 1, wherein the conductor layer overlays a sidewall of the cavity and extends to the core layer.

3. The PCB of claim 1, wherein the conductor is confined to an area over the air channel.

4. The PCB of claim 1, wherein at least one of the first and the second core layers comprise multiple layers.

5. The PCB of claim 1, wherein the cavity is formed in a core comprising at least one layer.

6. The PCB of claim 1, wherein the conductor extends, at least partially, into but not touching the cavity.

7. A method of fabricating an embedded air dielectric, the method comprising:

providing a conductor on a first core layer;

overlaying a conductor layer on an inner surface of a cavity formed in a second core layer;

positioning the conductor layer opposing and separated from the conductor;

forming a sealed air channel between the conductor and the conductor layer; and providing a low flow adhesive between the first core layer and the conductor layer at a periphery of an upper surface of the conductor layer to provide a seal for the sealed air channel.

8. The method of claim 7, wherein the conductor layer is overlaid on a sidewall of the cavity to the second core layer.

9. The method of claim 7, wherein the inner surface of the cavity includes a bottom surface and sidewalls overlaid by the conductor layer.

10. The method of claim 7, wherein at least one of the first and second core layers comprises multiple layers.

11. The method of claim 7, wherein a primary dielectric in the air channel between the conductor and the conductor layer is a gas.

12. A method of fabricating an embedded air dielectric, the method comprising:

providing a conductor on a first core layer;

overlaying a conductor layer on an inner surface of a cavity formed in a second core layer;

positioning the conductor layer opposing and separated from the conductor;

forming a sealed air channel between the conductor and the conductor layer;

placing a low flow adhesive between the first core layer and the second core layer but not in an area substantially between the conductor and the conductor layer; and laminating the first and second core layers together.

13. The method of claim 12, wherein the gas is substantially air.

14. A system comprising:

a printed circuit board (PCB), the PCB comprising:

a conductor formed on a surface of a first core layer;

a conductor layer overlaying an inner surface of a cavity formed in a second core layer, the inner surface of the cavity including a bottom surface and sidewalls overlaid by the conductor layer, wherein the conductor layer opposes the conductor;

a sealed air channel between and separating the conductor and the conductor layer from contacting each other; and a low flow adhesive between the first core layer and the conductor layer to, at least, provide a seal for the sealed air channel of the PCB; and an processor connected to the PCB.

15. The system of claim 14, wherein a primary dielectric in the air channel between the conductor and the conductor layer is a gas.

* * * * *